United States Patent [19]
Patel et al.

[11] Patent Number: 6,134,108
[45] Date of Patent: Oct. 17, 2000

[54] APPARATUS AND METHOD FOR AIR-COOLING AN ELECTRONIC ASSEMBLY

[75] Inventors: Chandrakant D. Patel, Fremont, Calif.; Guy Wagner, Loveland, Colo.; Abdlmonem H. Beitelmal, Santa Clara; Gustavo A. Chavez, Fremont, both of Calif.

[73] Assignee: Hewlett-Packard Company, Palo Alto, Calif.

[21] Appl. No.: 09/099,512

[22] Filed: Jun. 18, 1998

[51] Int. Cl.[7] .................................................... H05K 7/20
[52] U.S. Cl. ........................................... 361/695; 165/908
[58] Field of Search .................................. 165/80.4, 908; 174/16.3; 361/688–697; 415/177, 178

[56] References Cited

U.S. PATENT DOCUMENTS

| | | | |
|---|---|---|---|
| 4,756,473 | 7/1988 | Tatlemae et al. | 361/695 |
| 4,817,865 | 4/1989 | Wray | 361/695 |
| 5,019,880 | 5/1991 | Higgins, III | 361/694 |
| 5,361,188 | 11/1994 | Kondou et al. | 361/695 |
| 5,409,352 | 4/1995 | Lin et al. | 415/177 |
| 5,640,046 | 6/1997 | Suzuki et al. | 361/697 |
| 5,661,638 | 8/1997 | Mira | 361/697 |

FOREIGN PATENT DOCUMENTS

| | | | |
|---|---|---|---|
| 2034993 | 2/1990 | Japan | 361/694 |

OTHER PUBLICATIONS

"Burn–In Fixture for Moduler", IBM Tech Discl. Bulletin, vol. 27, No. 7B, Dec. 1984.

*Primary Examiner*—Gregory Thompson

[57] ABSTRACT

An improved cooling apparatus and related method are disclosed for air-cooling an array of electronic components mounted on a substrate. The cooling apparatus directs high-speed jets of cooling air directly at special heat sinks bonded to the particular electronic components that generate the most heat (e.g., microprocessors), with the air thereafter being directed to flow tangentially across the remaining components, to air-cool those components, as well. This configuration enables the requisite component cooling to be achieved with substantially reduced air flow rates and with heat sinks of substantially reduced size, as compared to prior cooling apparatus.

18 Claims, 3 Drawing Sheets

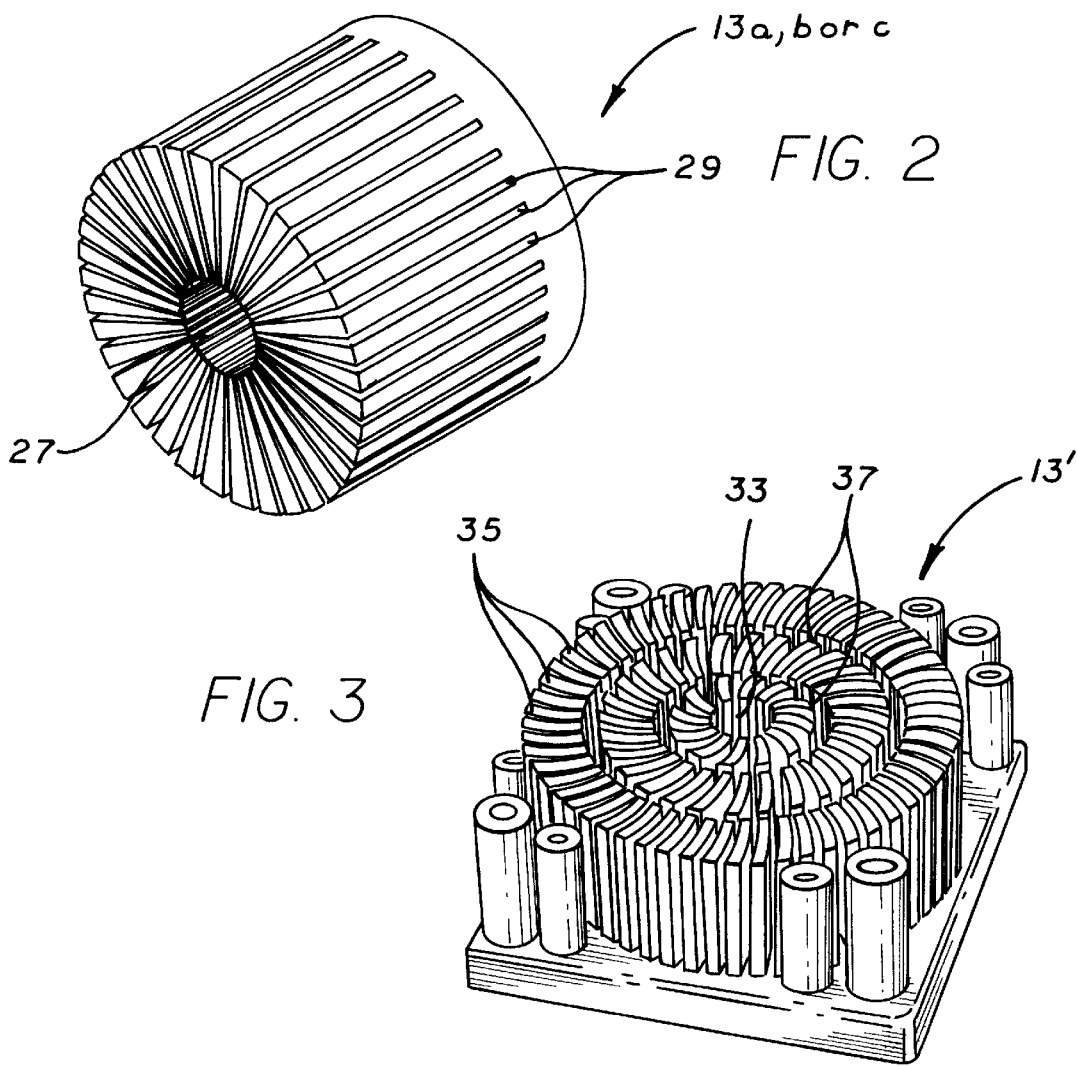
FIG. 2
FIG. 3
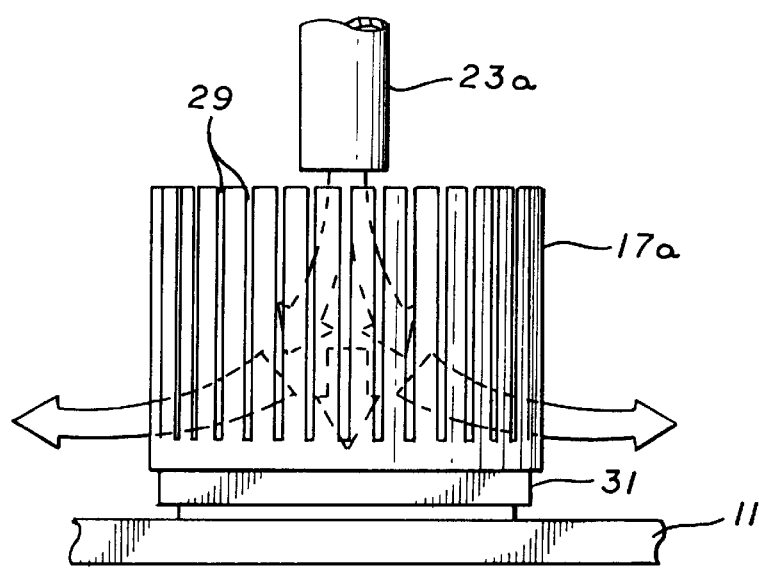
FIG. 4

APPARATUS AND METHOD FOR AIR-COOLING AN ELECTRONIC ASSEMBLY

BACKGROUND OF THE INVENTION

This invention relates generally to apparatus for cooling electronic assemblies and, more particularly, to cooling apparatus configured to direct air to flow across the electronic assemblies.

Apparatus of this particular kind are used in a wide variety of electronic equipment, especially equipment incorporating microprocessors, which can generate significant amounts of heat. Typically, such equipment mounts the microprocessor and other heat-generating components on one or more printed circuit (PC) boards, with one or more heat sinks also mounted on the board. A fan or blower directs a tangential flow of air across the PC board and heat sinks, to cool the components by convection. Properly cooling each microprocessor typically requires a volumetric flow of about 10 liters per second, at a velocity of about 2 meters per second.

Heat dissipation is a more difficult problem to address when the electronic equipment incorporates numerous microprocessors or other components and modules generating large amounts of heat. Some high-end servers, for example, can house as many as 64 microprocessors, with associated memory devices and ASICs, dissipating up to 12 kilowatts.

In such cases, cooling apparatus of the kind described briefly above are necessarily very large and complex. In addition, the tangential, unidirectional nature of the air flow causes the multiple components to be cooled in series. Consequently, the downstream components are cooled by preheated air and thus are cooled by lesser amounts than are upstream components. This drawback is alleviated somewhat by using a high air flow rate and by using heat sinks having large surface area. Heat sinks measuring 125 mm by 125 mm by 40 mm are commonly used. The large bulk volume flow also can require the use of several blowers and large exhaust ducting. The resulting size and complexity have detracted significantly from such electronic equipment's commercial viability.

It should, therefore, be appreciated that there is a need for an improved cooling system for high-performance electronic assemblies of the kind incorporating multiple microprocessors or other heat-generating components and modules, which is substantially smaller in size and less complex, yet which is reliable and effective in dissipating excess heat. The present invention fulfills this need and provides further related advantages.

SUMMARY OF THE INVENTION

The present invention is embodied in an improved cooling apparatus, and related method, for air-cooling an electronic assembly of a kind that mounts two distinct groups of electronic devices on a substrate, e.g., a printed circuit board. Each electronic device in the first group is configured to generate an amount of heat greater than a first predetermined threshold, and each electronic device in the second group is configured to generate an amount of heat less than a second predetermined threshold. An air source is included, for directing a separate jet of cooling air into the vicinity of each electronic device of the first group, to cool such devices with non-preheated air, after which the air is directed to flow past the second group of devices, to cool those devices, as well. The electronic devices thereby are cooled with enhanced efficiency, which leads to reduced size, complexity and cost.

More particularly, the cooling apparatus further includes a separate heat sink appropriately secured to each of the electronic devices in the first group of devices, with each heat sink incorporating a central recess, a lateral periphery, and a plurality of air paths connecting the central recess with the lateral periphery. In addition, the air source is configured to direct a separate air jet into the central recess of each of the plurality of heat sinks, whereupon the air exits therefrom via the plurality of air paths, to cool each of the heat sinks and thereby the associated electronic devices.

In more detailed features of the invention, the air source includes a plurality of ducts, each configured to direct an air jet to a separate one of the plurality of heat sinks. The air source further includes first and second blowers, each configured to supply pressurized air to a plenum, for delivery via the plurality of ducts to the heat sinks. The first and second blowers each can be operated at variable speeds, and a controller controllably supplies electrical power to the blowers, such that if both blowers are operating they are made to operate at relatively low speeds, whereas if only one blower is operating it is made to operate at a relatively high speed.

In other more detailed features of the invention, each heat sink has a generally cylindrical shape, with a first circular end secured to the electronic device being cooled and with a second, opposite circular end facing outwardly. The central recess is formed centrally in each heat sink's second circular end, and the plurality of air paths formed in each heat sink extend radially from the central recess to the outer periphery. In one embodiment, these air paths are arranged like radial spokes, whereas in an alternative embodiment, the air paths are arranged in a spiral pattern. The air paths preferably are evenly spaced around the circumference of each heat sink.

Other features and advantages of the present invention should become apparent from the following description of the preferred embodiment, taken in conjunction with the accompanying drawings, which illustrate, by way of example, the principles of the invention.

BRIEF DESCRIPTION OF THE DRAWINGS

FIG. 2 is an enlarged isometric view of one suitable heat sink included in the cooling apparatus of FIG. 1.

FIG. 3 is an enlarged isometric view of an alternative heat sink included in the cooling apparatus of FIG. 1.

FIG. 4 is an enlarged side view of one heat sink included in the cooling apparatus of FIG. 1, with the flow path of the high-speed air jet being depicted schematically.

DESCRIPTION OF THE PREFERRED EMBODIMENT

Figure 1:
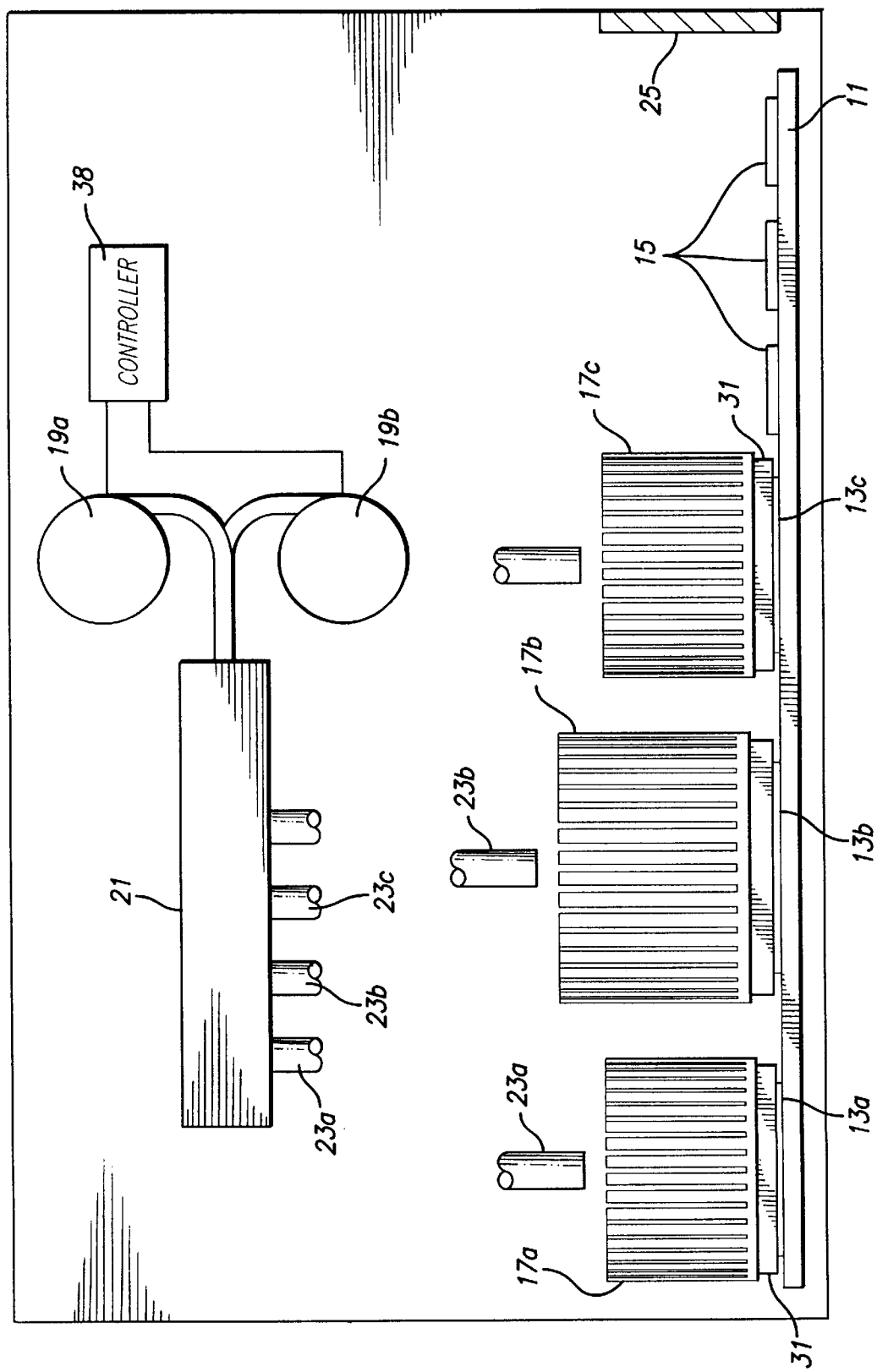
FIG. 1 is an elevational view of a cooling apparatus that embodies the invention, for cooling the electronic components mounted on a printed circuit board by delivering high-speed air jets directly to heat sinks associated with each of several microprocessors mounted on the board.

With reference now to the drawings, and particularly to FIG. 1, there is shown a cooling apparatus configured to cool an array of electronic components mounted on a printed circuit (PC) board 11. The electronic components include a number of microprocessors, several of which are depicted at 13a, 13b and 13c, which generate significant amounts of heat, e.g., 100 watts each. The electronic components further include additional devices 15, such as memory devices and ASICs, which generate lesser amounts of heat but nevertheless still require supplemental cooling. The cooling apparatus functions to efficiently cool all of these electronic components sufficiently to achieve optimal performance.

Special slotted heat sinks 17a, 17b and 17c are bonded to the respective microprocessors 13a, 13b and 13c (e.g., by soldering, epoxy, or thermal compound). Alternatively, the heat sinks can be mechanically clamped to the microprocessors. In addition, a pair of centrifugal blowers 19a and 19b are provided, for supplying pressurized air to a plenum 21, which in turn, supplies that pressurized air via ducts 23a, 23b and 23c directly to the sites of the respective heat sinks 17a, 17b and 17c. Specifically, each duct supplies a jet of non-preheated cooling air, having a speed in the range of 8 to 10 meters per second. Not shown in the drawings, additional heat sinks can be mounted on the PC board 11, each receiving a jet of cooling air from a separate duct connected to the plenum.

The jets of cooling air delivered to the heat sinks 17a, 17b and 17c, after moving past the heat sinks, then form a tangential flow across the other components mounted on the PC board 11, for discharge via an exhaust port 25. It thus will be appreciated that the particular components that are most in need of supplemental cooling (e.g., the microprocessors 13a, 13b and 13c) are cooled by high-speed jets of non-preheated air, while the remaining components, which require less supplemental cooling, are cooled by a tangential flow of air that has been preheated. Not only does this approach increase cooling efficiency, but it also enables the heat sinks to be reduced in size as compared to what would otherwise be required.

FIG. 2 depicts one suitable configuration for the heat sinks 17a, 17b and 17c. The depicted heat sink has a generally cylindrical shape, with a cylindrical recess 27 formed in the center of each heat sink's exposed, upper circular surface, and with a number of narrow slots 29 (e.g., 36 slots) formed between that recess and the heat sink's outer cylindrical surface. These slots are arranged at uniform circumferential intervals, and they extend from the upper circular surface nearly all of the way to the lower circular surface.

Each heat sink 17a, 17b or 17c can be formed from round metal stock, and its cylindrical recess 27 and plurality of narrow slots 29 can be formed by machining. The heat sinks preferably are formed of aluminum or, alternatively, a composite of aluminum and silicon carbide, available from Alcoa. These materials have a relatively low specific gravity, but high specific heat, and they are suitable for use with solder, epoxy, and/or thermal compound bonding. Optionally, a circular disc 31, of similar material, can be interposed between the heat sink and the underlying electronic component.

In use, and as shown in FIGS. 1 and 4, the ducts 23a, 23b and 23c are arranged to direct cooling air directly into the cylindrical recesses 27 of the respective heat sinks 17a, 17b and 17c. This air then passes radially outwardly through the plurality of narrow slots 29. The cylindrical recess and slots, together, provide substantial surface area from which heat generated by the underlying microprocessors 13a, 13b and 13c can be transferred.

FIG. 3 depicts an alternative configuration for the heat sinks 17a, 17b and 17c. The depicted heat sink 13' has a cylindrical shape and a cylindrical recess 33 like that of the heat sink configuration of FIG. 2, but it differs from that configuration in that it incorporates narrow walls 35 that cooperate to define a plurality of spiral slots. Periodic gaps in the walls cooperate to define concentric channels 37 that aid in establishing the desired air flow pattern. This configuration for the slots provides substantial surface area for transferring heat to the cooling air moving through them. Suitable heat sinks having this configuration can be obtained from a Japanese company called Alpha. They are formed of aluminum and are produced by forging.

It will be appreciated that heat sinks having other configurations also can be used. For example, the heat sinks can each have a generally rectangular shape, with parallel channels through which the jets of air can pass. The air can be directed to flow tangentially through the channels, if vertical space above the heat sink is limited. Alternatively, the heat sinks can each have the same radial and spiral slot configuration as the heat sinks of FIGS. 2 and 3, except that their cylindrical side walls can be modified to have one or more flat sides.

With reference again to FIG. 1, the two centrifugal blowers 19a and 19b that deliver cooling air to the plenum 21 are operable at variable speeds. The blowers are sized such that, in normal operation, each is operated at just one half of its maximum speed. The connection of the two blowers to a single plenum ensures that if either blower fails, the remaining one can be operated at its full capacity without adversely affecting the apparatus' cooling capability. This control is achieved by a controller 38.

Figure 5:
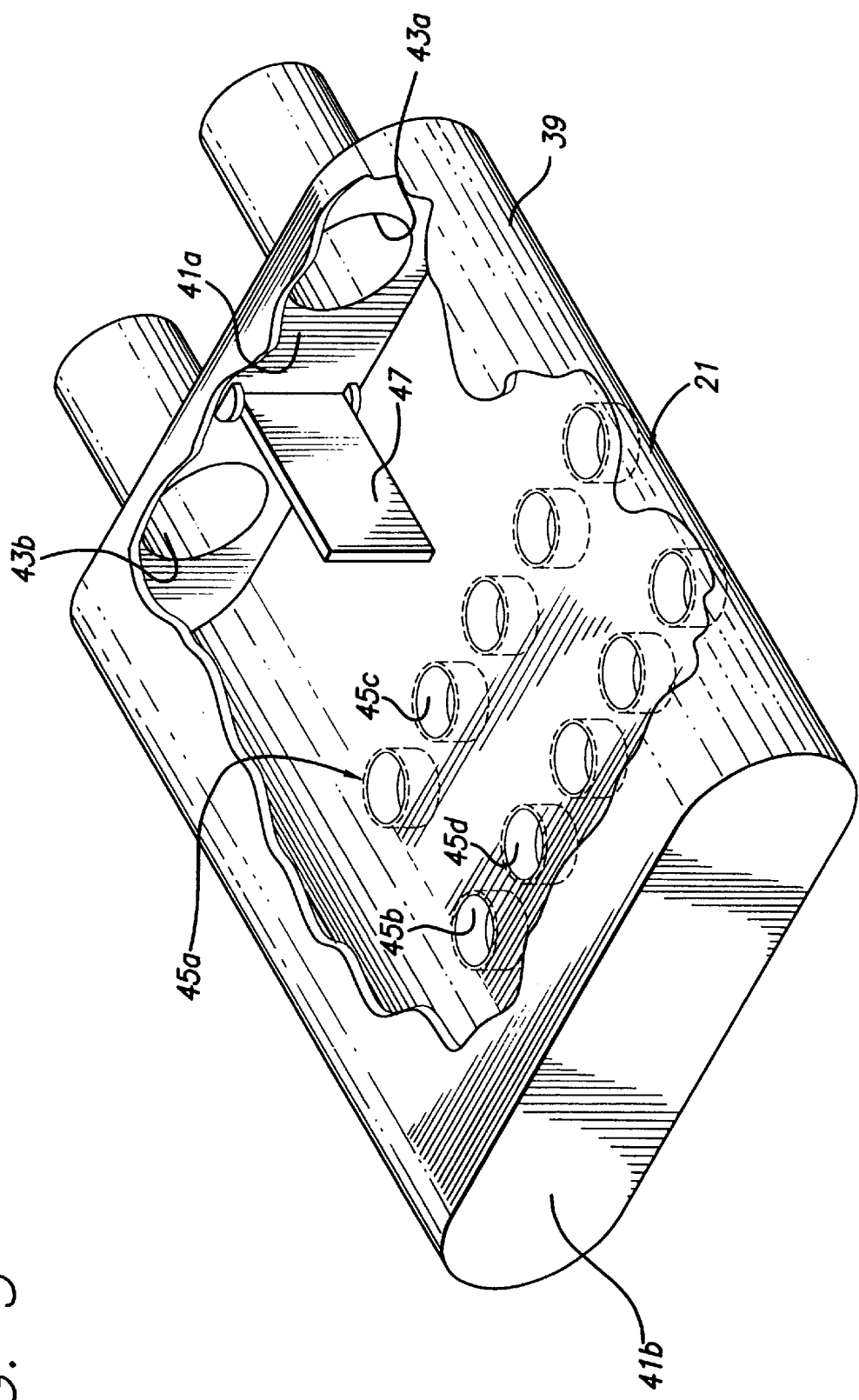
FIG. 5 is an enlarged isometric view, partially broken away, of the plenum included in the cooling apparatus of FIG. 1

The plenum 21 is depicted in greater detail in FIG. 5. It is formed from a plastic sheet that is formed into a wall 39 having a generally oval shape, after suitable preheating. End caps 41a and 41b close off the plenum's interior. Side-by-side inlet ports 43a and 43b are provided in the end cap 41a, for connection to the respective blowers 19a and 19b. In addition, an array of outlet ports 45a, 45b, etc. are formed in the oval wall, for individual connection to the plurality of ducts 23a, 23b, etc., respectively. A flapper valve 47 is pivotally secured to the inward facing side of the end cap 41a, between the two inlet ports 43a and 43b, to ensure uninterrupted operation when one of the blowers is shut down.

The blowers 19a and 19b are each sized to provide a nominal volume flow rate of about three liters per second per location. At this flow rate, twenty separate heat sinks 17 can be accommodated by supplying air at a volume flow rate of about 60 liters per second, or about 125 cubic feet per minute. This flow rate is approximately one third that of a similarly sized electronic assembly cooled by a conventional cooling apparatus. Suitable centrifugal blowers can be obtained from Ametek, Inc., of Kent, Ohio, at pressures up to about 30 inches of water. Multiple blowers can provide the requisite air flow rate.

One drawback to the jetted air-cooling apparatus described above is that it can generate significant amounts of noise, particularly from the air being drawn into the blowers 19a and 19b. This noise can be alleviated by encapsulating the blowers with foam-plastic barrier material (not shown) and by placing this same material around the plenum 21 and its outlet ports 45a, 45b, etc. One suitable barrier material is a PBM material available from a company called Soundcoat, of Irvine, Calif. The noise also can be alleviated by configuring the inlet ducts for the blowers to have a serpentine pattern.

It should be appreciated from the foregoing description that the present invention provides an improved cooling apparatus for an array of electronic components mounted onto a PC board. The cooling apparatus directs high-speed jets of cooling air directly at special heat sinks bonded to the particular electronic components that generate the most heat, with the air thereafter being directed to flow tangentially across the remaining components, to cool those components, as well. This configuration enables the requisite component cooling to be achieved with substantially reduced air flow rates and with heat sinks of substantially reduced size, as compared to prior apparatus. This, in turn, enables a substantially higher packing density, and lower cost, to be achieved.

Although the invention has been described in detail with reference only to the presently preferred embodiment, those of ordinary skill in the art will appreciate that various modifications can be made without departing from the invention. Accordingly, the invention is defined only by the following claims.

We claim:

1. An air-cooled electronic system, comprising:

a substrate;

first and second groups of electronic devices mounted on the substrate, wherein each electronic device in the first group is configured to generate an amount of heat greater than a first predetermined threshold and each electronic device in the second group is configured to generate an amount of heat less than a second predetermined threshold;

a plurality of heat sinks, each secured to a separate one of the electronic devices in the first group of devices, in a manner by which heat can be transported from each such device to the corresponding heat sink, wherein each heat sink is configured to include a central recess, a lateral periphery, and a plurality of air paths connecting the central recess with the lateral periphery; and an air source including a plurality of ducts, each duct configured to emit a separate jet of cooling air and to direct this air jet into the central recess of a separate one of the plurality of heat sinks, whereupon the air exits therefrom via the plurality of air paths, to cool the heat sinks and thereby the associated electronic devices in the first group of devices with non-preheated air, after which the air is directed to flow past the electronic devices in the second group of devices, to cool those devices, as well;

wherein each of the plurality of ducts terminates at a location spaced from its associated heat sink, such that air located between the duct and the heat sink is entrained by the air jet emitted by the duct and directed with the air jet toward the heat sink, to enhance the cooling effect.

2. An air-cooled electronic system as defined in claim 1, wherein the air source further includes a plenum that delivers pressurized air to the plurality of ducts.

3. An air-cooled electronic system as defined in claim 1, wherein the air source further includes:

first and second blowers, each configured to supply pressurized air; and a plenum configured to receive pressurized air from the first and second blowers, for delivery to the plurality of ducts.

4. An air-cooled electronic system as defined in claim 3, wherein:

the first and second blowers are each operable at a controllably variable volume flow rate; and the air source further includes a controller that controllably supplies electrical power to the first and second blowers, such that if both blowers are operating they are made to operate at relatively low volume flow rates, whereas if only one blower is operating it is made to operate at a relatively high volume flow rate.

5. Apparatus for air-cooling an electronic device of a first type and an electronic device of a second type, both of such electronic devices being carried on a substrate, comprising:

a heat sink secured to the electronic device of the first type in a manner by which heat can be transported from such device to the heat sink, wherein the heat sink is configured to include a central recess, a lateral periphery, and a plurality of air paths connecting the central recess with the lateral periphery;

wherein the electronic device of the second type does not mount a corresponding heat sink; and an air source including a duct that terminates at a location spaced from the heat sink and that is configured to direct an air jet into the central recess of the heat sink, whereupon the air exits therefrom via the plurality of air paths, to cool the heat sink and thereby the associated electronic device, wherein the spacing of the duct from the heat sink ensures that air located between the duct and the heat sink is entrained by the air jet and directed with the air jet toward the heat sink, to enhance the cooling effect;

and wherein the apparatus is configured to direct air exiting from the heat sink tangentially across the electronic device of the second type, to air-cool that device as well.

6. Apparatus as defined in claim 5, wherein:

the apparatus flier functions to air-cool one or more additional electronic devices of the first type and one or more additional electronic devices of the second type, all of such devices being mounted on the substrate;

the apparatus further comprises one or more additional heat sinks secured to the one or more additional electronic devices of the first type, wherein each such additional heat sink is configured to include a central recess, a lateral periphery, and a plurality of air paths connecting the central recess with the lateral periphery;

the one or more additional electronic devices of the second type do not mount corresponding heat sinks;

the air source further includes one or more additional ducts that each terminate at a location spaced from a separate one of the one or more additional heat sinks and that each are configured to emit a separate jet of cooling air and to direct this air jet into the central recess of a separate one of the one or more additional heat sinks, whereupon the air exits therefrom via the plurality of paths, to cool the one or more additional heat sinks and thereby the associated one or more additional electronic devices of the first type, wherein the spacing of each of the one or more additional ducts from a separate one of the one or more additional heat si ensures that air located between such duct and heat sink is entrained by the air jet and directed with the air jet toward the heat sink, to enhance the cooling effect; and the apparatus is configured to direct air exiting from the one or more additional heat sinks tangentially across the one or more additional electronic devices of the second type, to air-cool those devices as well.

7. Apparatus as defined in claim 5, wherein the air source further includes a plenum that delivers pressurized air to the ducts.

8. Apparatus as defined in claim 5, wherein the air source further includes:

first and second blowers, each configured to supply pressurized air; and a plenum configured to receive pressurized air from the first and second blowers, for delivery to the duct.

9. Apparatus as defined in claim 8, wherein:

the first and second blowers are each operable at a controllably variable volume flow rate; and the air source further includes a controller that controllably supplies electrical power to the first and second blowers, such that if both blowers are operating they are made to operate at relatively low volume flow rates, whereas if only one blower is operating it is made to operate at a relatively high volume flow rate.

10. Apparatus as defined in claim 5, wherein:

the heat sink has a generally cylindrical shape, with a first circular end secured to the device being cooled and with a second, opposite circular end facing outwardly;

the central recess of the heat sink is formed centrally in the heat sink's second circular end; and the plurality of air paths formed in the heat sink extend radially from the central recess to the outer periphery.

11. Apparatus as defined in claim 10, wherein the plurality of air paths formed in the heat sink form spirals extending between the central recess and the outer periphery.

12. Apparatus as defined in claim 10, wherein the plurality of air paths are arranged substantially uniformly around the circumference of the heat sink.

13. A method for cooling an electronic system of a kind that includes first and second groups of electronic devices mounted onto a substrate, wherein each electronic device in the first group is configured to generate an amount of heat greater than a first predetermined threshold and each electronic device in the second group is configured to generate an amount of heat less than a second predetermined threshold, wherein the electronic system further includes a plurality of heat sinks, each heat sink secured to a separate one of the electronic devices in the first group of devices and configured to include a central recess, a lateral periphery, and a plurality of air paths connecting the central recess with the lateral periphery, and wherein the electronic system further includes a plurality of ducts, each terminating at a location spaced from the central recess of a separate heat sink, wherein the method comprises:

channeling cooling air through the plurality of ducts, such that a separate jet of air is emitted from each duct and such that air located between each duct and its associated heat sink is entrained by the air jet and directed with air jet toward the central recess of the heat sink, whereupon the air exits from the heat sink via its plurality of air paths, to cool the heat sinks and thereby their associated electronic devices in the first group of devices with non-preheated air, after which the air is directed to flow past the electronic devices in the second group of devices, to cool those devices, as well.

14. A method as defined in claim 13, and further comprising channeling the cooling air through a plenum connected to the plurality of ducts.

15. A method as defined in claim 13, and further comprising:

providing first and second blowers, each configured to supply pressurized air; and providing a plenum for receiving pressurized air from the first and second blowers, for delivery to the plurality of ducts.

16. A method as defined in claim 15, wherein:

the first and second blowers are each operable at a controllably variable volume flow rates; and the method further comprises controllably supplying electrical power to the first and second blowers, such that if both blowers are operating they are made to operate at relatively low volume flow rates, whereas if only one blower is operating it is made to operate at a relatively high volume flow rate.

17. Apparatus for air-cooling a plurality of electronic devices carried on a substrate, comprising:

a plurality of heat sinks, each secured to a separate one of the plurality of electronic devices in a manner by which heat can be transported from the device to the heat sink, wherein each heat sink is configured to include a central recess, a lateral periphery, and a plurality of air paths connecting the central recess with the lateral periphery;

first and second blowers, each configured to supply pressurized air at a controllably variable volume flow rate;

a plenum including first and second inlet ports connected to the respective first and second blowers and firer including, a plurality of outlet ports and a valve that closes the first inlet port or second inlet port if the associated blower is not operating;

a plurality of ducts connected to the plurality of outlet ports of the plenum, for delivering a plurality of air jets into the central recesses of the plurality of heat sinks, whereupon the r exits therefrom via the plurality of air paths, to cool the heat sinks and thereby the associated electronic devices; and a controller that controllably supplies electrical power to the first and second blowers, such that if both blowers are operating they are made to operate at relatively low volume flow rates, whereas if only one blower is operating it is made to operate at a relatively high volume flow rate.

18. Apparatus as defined in claim 17, wherein:

the first and second inlet ports of the plenum are located adjacent to each other; and the valve is a flapper valve located between the first and second inlet ports and configured to pivot automatically between a first position, in which it closes the first inlet port, and a second position, in which it closes the second inlet port.

* * * * *